(12) United States Patent
Carley et al.

(10) Patent No.: US 7,153,717 B2
(45) Date of Patent: Dec. 26, 2006

(54) ENCAPSULATION OF MEMS DEVICES USING PILLAR-SUPPORTED CAPS

(75) Inventors: L. Richard Carley, Sewickley, PA (US); Suresh Santhanam, Cranberry Township, PA (US); Hsu Yu-Nu, Pittsburgh, PA (US)

(73) Assignee: IC Mechanics Inc., Pittsburgh, PA (US)

( * ) Notice: Subject to any disclaimer, the term of this patent is extended or adjusted under 35 U.S.C. 154(b) by 0 days.

(21) Appl. No.: 10/319,174

(22) Filed: Dec. 13, 2002

(65) Prior Publication Data

US 2003/0153116 A1    Aug. 14, 2003

Related U.S. Application Data

(63) Continuation-in-part of application No. 09/583,386, filed on May 30, 2000, now Pat. No. 7,008,812.

(51) Int. Cl.
*H01L 21/00* (2006.01)
(52) U.S. Cl. ...................................................... 438/55
(58) Field of Classification Search ............ 438/50–53, 438/725, 125, 127, 55
See application file for complete search history.

(56) References Cited

U.S. PATENT DOCUMENTS

| 4,665,610 | A | * | 5/1987 | Barth .......................... 438/53 |
| 5,683,591 | A | | 11/1997 | Offenberg |
| 5,834,333 | A | * | 11/1998 | Seefeldt et al. ............... 438/52 |
| 6,323,982 | B1 | * | 11/2001 | Hornbeck ................... 359/224 |
| 6,441,451 | B1 | * | 8/2002 | Ikeda et al. ................. 257/418 |
| 2004/0036133 | A1 | * | 2/2004 | Rodgers ..................... 257/415 |

* cited by examiner

*Primary Examiner*—Carl Whitehead, Jr.
*Assistant Examiner*—Monica D Harrison
(74) *Attorney, Agent, or Firm*—Mark G. Lappin; Greenberg Traurig LLP

(57) ABSTRACT

This invention comprises a process for fabricating a MEMS microstructure in a sealed cavity wherein the etchant entry holes are created as a by-product of the fabrication process without an additional step to etch holes in the cap layer. The process involves extending the layers of sacrificial material past the horizontal boundaries of the cap layer. The cap layer is supported by pillars formed by a deposition in holes etched through the sacrificial layers, and the etchant entry holes are formed when the excess sacrificial material is etched away, leaving voids between the pillars supporting the cap.

26 Claims, 13 Drawing Sheets

ENCAPSULATION OF MEMS DEVICES USING PILLAR-SUPPORTED CAPS

RELATED APPLICATIONS

The application is a continuation-in-part of application Ser. No. 09/583,386, entitled "Manufacturing Of MEMS Structures in A Sealed Cavity Using Dry-Release Device Encapsulation" which was filed May 30, 2000 now U.S. Pat. No. 7,008,812.

FIELD OF THE INVENTION

This invention relates to the process of manufacturing micro-electro-mechanical systems (MEMS), and, in particular, to MEMS devices having sealed cavities or encapsulated movable parts.

BACKGROUND OF THE INVENTION

It is known in the prior art to create sealed cavities on an integrated circuit for a variety of applications, for example, as a speaker or microphone. It is also known to encapsulate movable mechanical components on an integrated circuit within a sealed cavity. The encapsulation of micro-electromechanical structures in a sealed cavity is desirable for several reasons. First, the tolerance of the structures to ambient conditions, such as high humidity, is greatly improved. Second, the dicing and packaging of the MEMS devices is greatly facilitated. Third, when the cavity is at a low or very low ambient pressure, the Brownian noise due to the motion of gas molecules can be significantly reduced.

Processes to create sealed cavities on the surface of a silicon wafer using only thin film deposition and etching techniques have already been developed to create MEMS microphones and speakers for sound and ultrasound. Starting with a silicon substrate, which could in principle have CMOS devices and interconnects already patterned onto it, a protective layer is placed over the entire wafer. Next a sacrificial layer is deposited. Then, the sacrificial layer is patterned to remove it over all parts of the wafer that are not going to be microencapsulated. Next, an encapsulating layer is deposited over the entire wafer. Very small holes are then patterned and etched through the encapsulating layer at selected positions over the sacrificial layer, and the wafer is immersed in a liquid chemical bath containing an etchant that is highly selective, to dissolve the sacrificial layer while not attacking the encapsulating layer or the protective layer. Finally, an insulating or conducting layer that will act to seal the membrane must be deposited onto the wafer. The etch access hole can be sealed off either by material accumulating up from or by material depositing laterally on the sides of the hole growing inward and sealing off the hole. In either case, the final layer serves to both plug the etch holes and to seal the cavity created when the sacrificial material was etched away.

It is also known to create MEMS microstructures within sealed cavities such as the one described above. See, for example, U.S. Pat. Nos. 5,285,131 and 5,493,177 (both to Muller, et al.) in which methods to create an incandescent lamp and a vacuum tube respectively are disclosed. The method disclosed is as follows. A silicon substrate is covered with a non-etchable protective layer that is selectively removed, thereby exposing the silicon wafer in the region to be encapsulated. Then, a layer of poly-silicon is deposited and patterned to cover the exposed silicon window and extending up onto the silicon nitride protection layer in selected positions that will be used as entry points for the liquid etching agents. Non-etchable conductors are then deposited and patterned on top of both the non-etchable mask layer and on top of the silicon substrate in the window. Next, a sacrificial layer is deposited and etched so that it only covers the structures in the region to be encapsulated. The encapsulation process proceeds with the deposition of an encapsulation layer and the etching of small holes in the encapsulation layer located over the poly-silicon above the protection layer that will guide the etching agents into the cavity. In this case, the etching step requires two different liquid etchants—the first one to selectively etch away silicon and poly-silicon and a second one to etch away the sacrificial layer. The encapsulation process is completed by depositing a seal layer to seal up the etch entry holes in the diaphragms.

It is desirable to use a wet etchant, in many cases hydro-fluoric acid, because of its high degree of selectivity, that is, the ability to selectively etch away the sacrificial layers, leaving behind the microstructure and cavity walls. However, one unfortunate problem when working with a "wet" etchant is that the surface tension generated as the liquid evaporates can be strong enough to bend or even break delicate MEMS microstructures. Therefore, the use of liquid etching agents severely limits the complexity of the MEMS microstructures that can be released from sacrificial layers in the cavity because only very stiff MEMS microstructures can tolerate the surface tension forces exerted by typical liquid etching agents as the surface is drying. MEMS devices having suspended structures have been developed using a wet release etch. However, the structures were quite simple, for example, wires supported at both ends with a small number of meanders. However, in order to create a wide range of MEMS devices, for example, acceleration sensors, quite flexible MEMS structures are necessary. These flexible structures would most likely be destroyed by the surface tension effects of a wet etch.

In the parent application, we disclosed a method to etch encapsulated MEMS devices using a dry-etchant, to eliminate the negative effects of surface tension associated with a wet release of the device. This process involved covering the device with a cap, etching holes in the cap and introducing the dry etchant through the etched holes to dry-release the device. One problem associated with this technique is that the placement of the etchant holes is restricted to areas of the cap not directly above the device itself, such that when the etchant holes are sealed, no undesirable material is deposited directly on the device. This problem introduced undesirable constraints with respect to the design of the device, which must be designed such that room is left for etchant holes to be made which will not result in the deposition of undesirable material on the device when the holes are sealed. Additionally, the holes through which the etchant was introduced had to be very small to avoid having the holes directly above the device. This results in access openings with very small aspect ratios, which significantly lengthens etch times.

It is therefore desirable to modify the method of the parent application to remove the undesirable design constraints.

SUMMARY OF THE INVENTION

This invention is an improvement on our prior invention described in the parent application for the dry-release of encapsulated MEMS devices. The improvement involves supporting the cap, during the release etching, on a plurality of pillars such that etchant can be introduced from the sides of the cap between the support pillars rather than through holes etched into the top of the cap. The holes are then sealed during a subsequent deposition step. The holes are formed by depositing the cap layer such that it does not extend past the horizontal boundaries of the uppermost sacrificial layer. When the etchant is introduced, large holes are opened up between the plurality of pillars which are supporting the cap layer around its outermost edges.

With this improvement, it is no longer necessary to etch very small holes in the cap through which the dry etchant is introduced into the encapsulation chamber. In the improved process, all of the space between the pillars is available for the introduction of the dry etchant. Additionally, it is no longer necessary to constrain the design if the encapsulated MEMS device to ensure that etch holes are not present over the top of the structure; the entire inside of the encapsulated cavity can be used for the device because the etching of holes in the cap layer has been eliminated.

Lastly, wafers prepared according to this method are more efficiently etched with a barrel etcher. This is because the radial orientation of the etchant entry holes along the sides of the cap allows the etchant to reach the entry holes more easily when the wafers are stacked parallel to each other, as is typically done with a barrel etcher, as opposed to wafers prepared according to the prior art, which have the etchant entry holes etched through the top of the cap layer. In the prior art case, when a barrel etcher is used it is necessary for the etchant to change directions at least twice—it starts moving parallel to the wafers above the cap layer, turns to go through the etch access holes, and then turns to move parallel to the wafer beneath the cap layer.

DETAILED DESCRIPTION

This invention pertains to gas phase release of any number of encapsulated microstructure layers whose movement is independent or coupled and which are encapsulated in a thin film seal layer. To explain the invention, an example of a microstructure that can be utilized as a Z-axis accelerometer will be used. This device consists of a paddle shaped MEMS microstructure anchored at one point by a thin supporting member such that it can move in the Z direction within the sealed cavity. This structure is meant to be an exemplar only to illustrate the method, and the invention is not meant to be limited thereby.

Figure 1A:
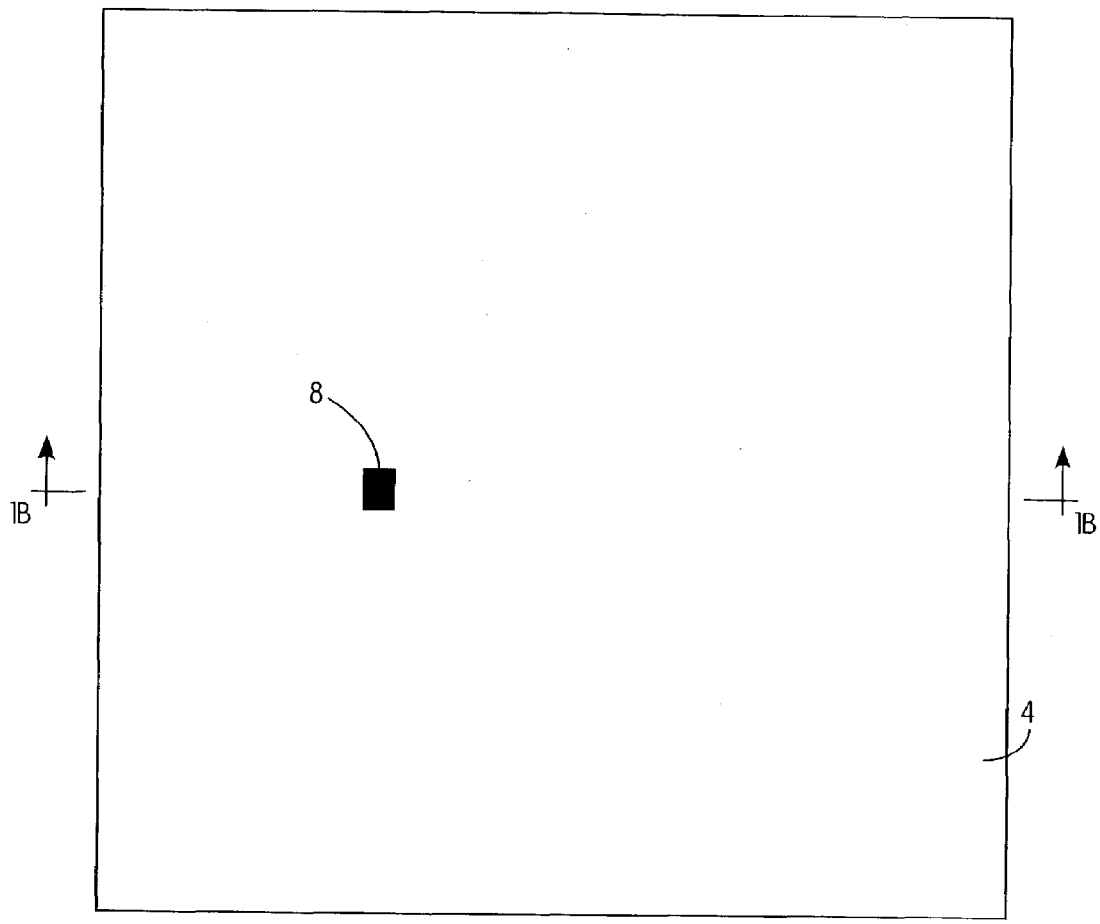
FIGS. 1A and 1B show a top view and a side cross-sectional view respectively of the silicon CMOS wafer used as the base of the MEMS micro-encapsulated structure.
Figure 1B:
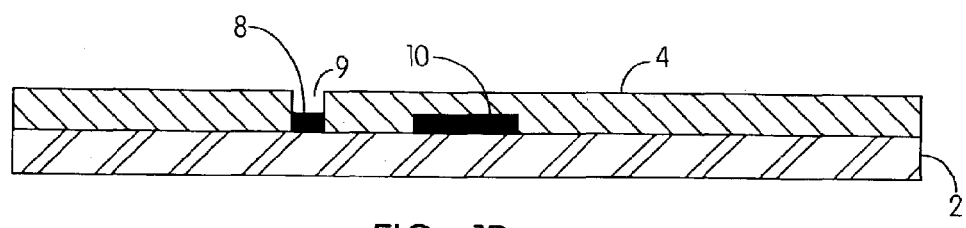

The figures illustrate the sequence of steps for fabricating the proposed encapsulated microstructure. We start by obtaining or fabricating a silicon CMOS wafer 2 coated with a layer of silicon nitride 4 or other insulator and having metal pads 8 and 10 interfacing with the original CMOS integrated circuit as shown in FIGS. 1A and 1B. Hole 9 appears in silicon nitride layer 4 to allow access to metal pad 8. In the preferred embodiment, the metal pad would be aluminum, but may alternatively be copper or any other conductive material. Additional metal pads may be provided where necessary to allow access to the CMOS integrated circuit using methods well known in the art, as dictated by the specific microstructure. Alternatively, and depending on the application, the substrate could also be gallium arsenide having an insulating layer deposited thereon, alumina, "silicon on insulator" (SOI) or sapphire.

Figure 2A:
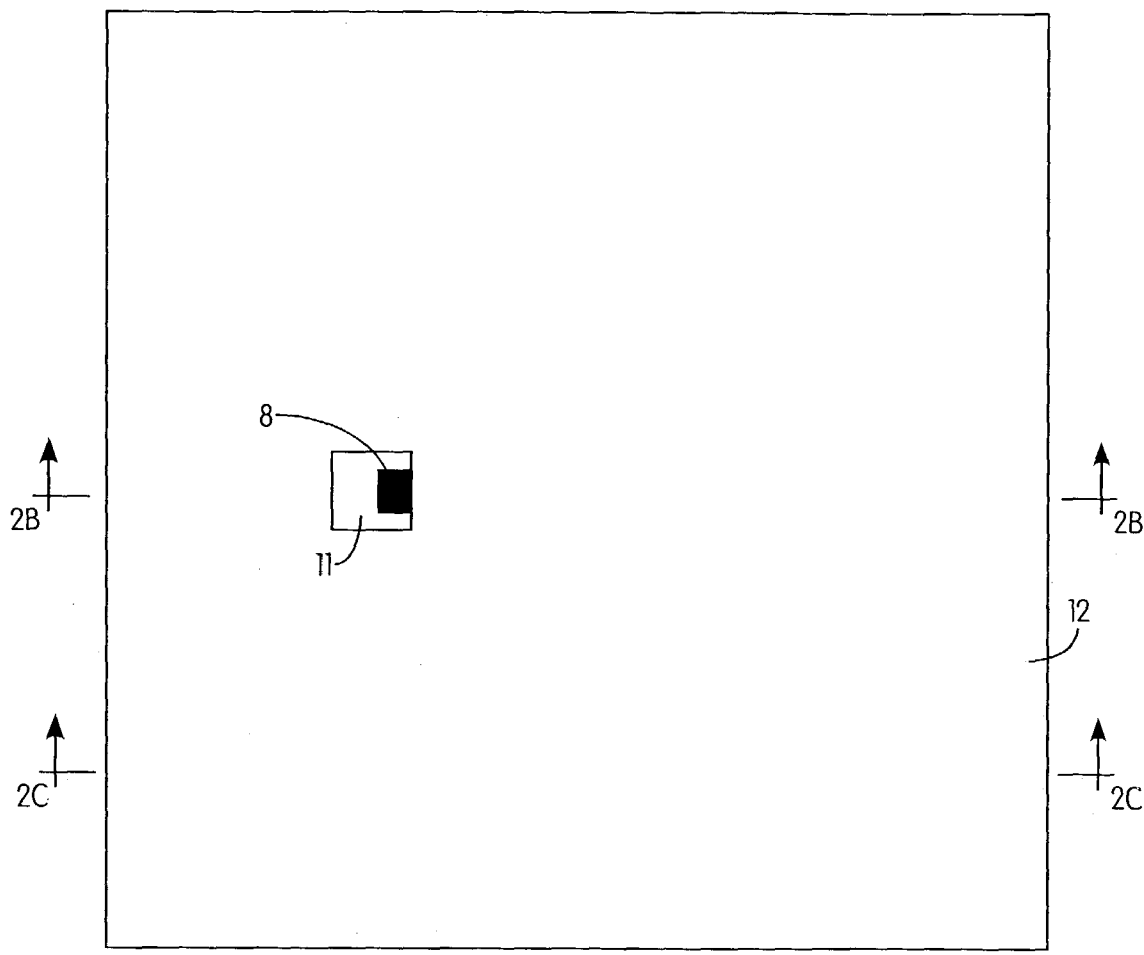
FIGS. 2A, 2B and 2C show a top view and a cross-sectional views respectively of the wafer with a sacrificial layer deposited thereon.
Figure 2B:
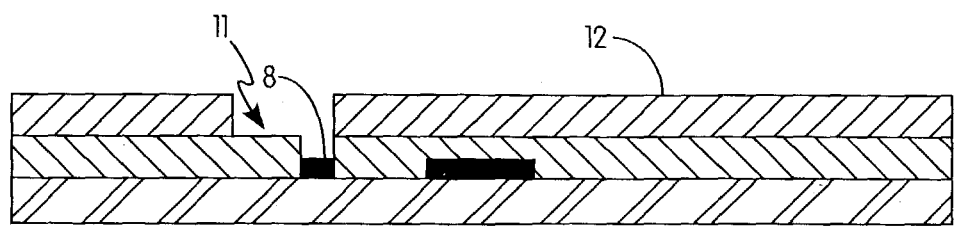
Figure 2C:
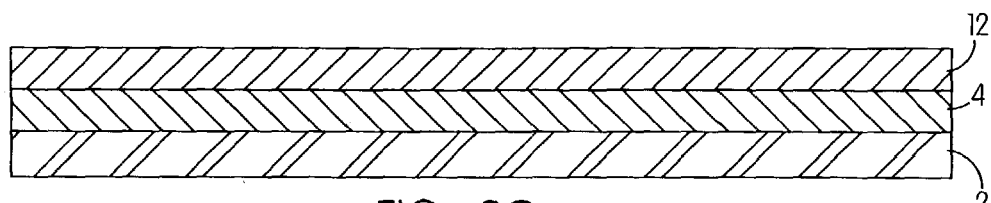

To begin the fabrication process, as shown in FIGS. 2A, 2B and 2C, a layer of sacrificial material 12 is deposited on top of the passivation layer of the standard CMOS wafer 2, which in this case is silicon nitride layer 4. Preferably, sacrificial layer 12 is a material that is highly reactive to a dry oxygen plasma etchant, such as photoresist, polyimide, etc. This layer may be etched in area 11 to provide a place on passivation layer 4 to anchor the microstructure.

The MEMS device fabrication steps are all performed at low temperature on top of the complete CMOS wafer 2, leaving the circuitry therein undisturbed. Access vias in passivation layer 4 are left during the CMOS IC design and sacrificial layer 12 is removed over these vias if access to the metal contacts is desired. The exposed metal pad 8 is then used to make connections between the MEMS microstructure and the CMOS circuitry in silicon CMOS wafer 2 below. This is illustrated in FIG. 2A.

Microstructure 14 may be composed of any metal, for example, Al, W, Ti, Ta, Cu, Ni, Mo, etc., but in the preferred embodiment would be made of aluminum. The selection of material for a particular microstructure layer is dictated by several factors. First, how much residual stress gradient in the material is acceptable for a particular application; second, by the availability of a selective etchant that removes sacrificial material, but which has a low etch rate with respect to silicon nitride passivation layer 4 and microstructure 14; and third, the density of the material such that the device can meet the needs of the specific application.

Figure 3A:
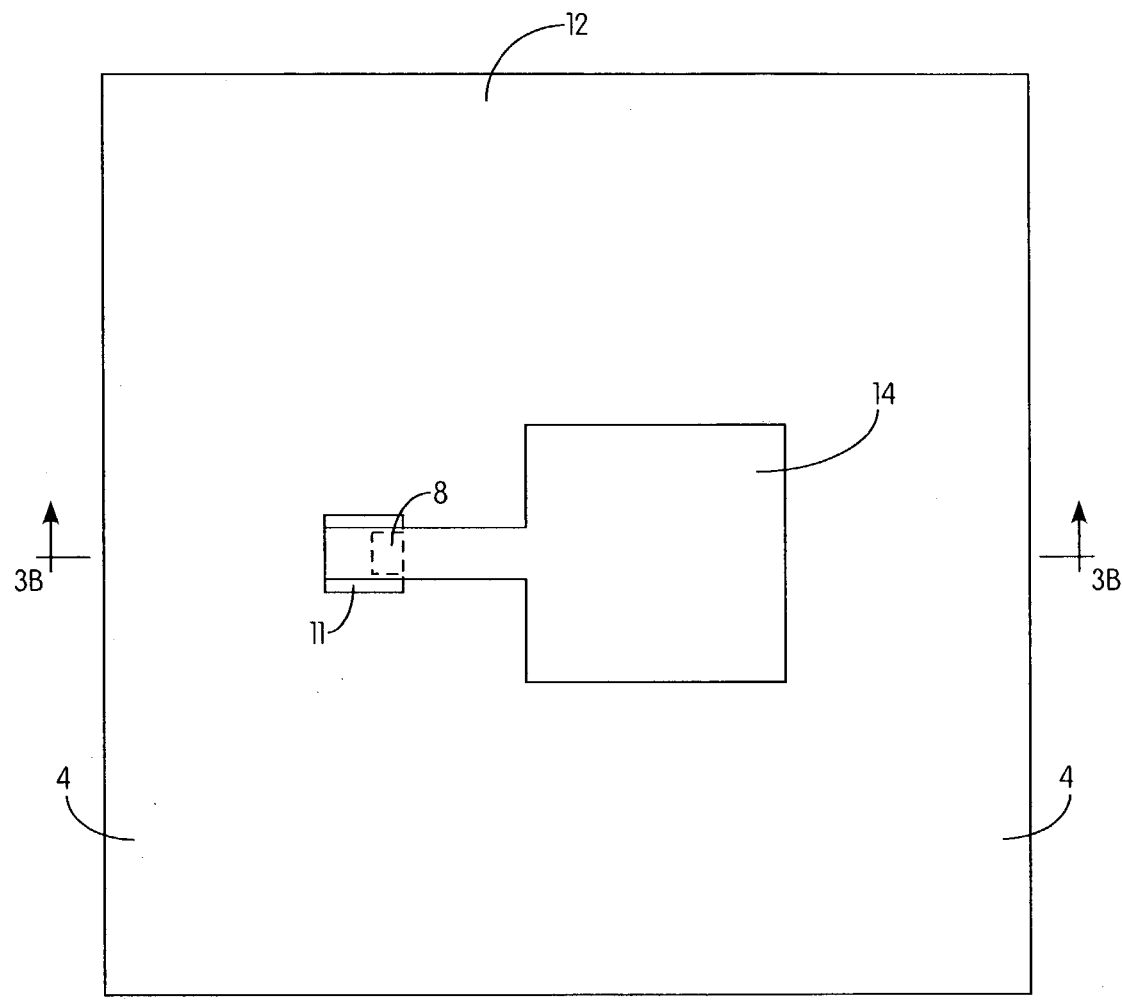
FIGS. 3A and 3B show a top view and a cross-sectional view respectively of the wafer having a structural layer added thereon.
Figure 3B:
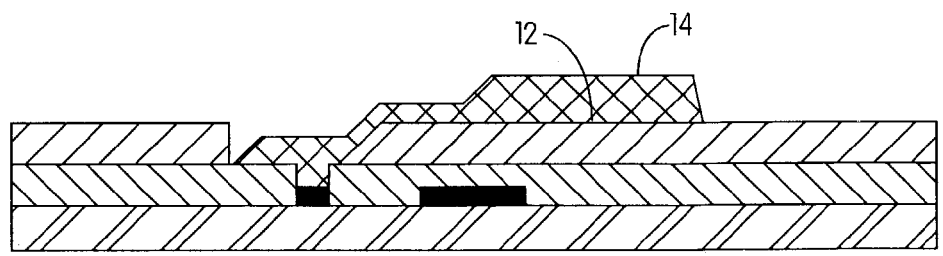

The deposition of the MEMS structural layer is shown in FIGS. 3A and 3B. MEMS microstructure 14 is deposited by prior art methods known to those with ordinary skill in the art, and the undesirable portions are etched away, thereby leaving the desired shape of microstructure 14 behind. The top view in FIG. 3A clearly shows the shape of the exemplary microstructure as being a paddle having a long thin beam attached to an anchor point, which in this case is metal contact 8.

Figure 4A:
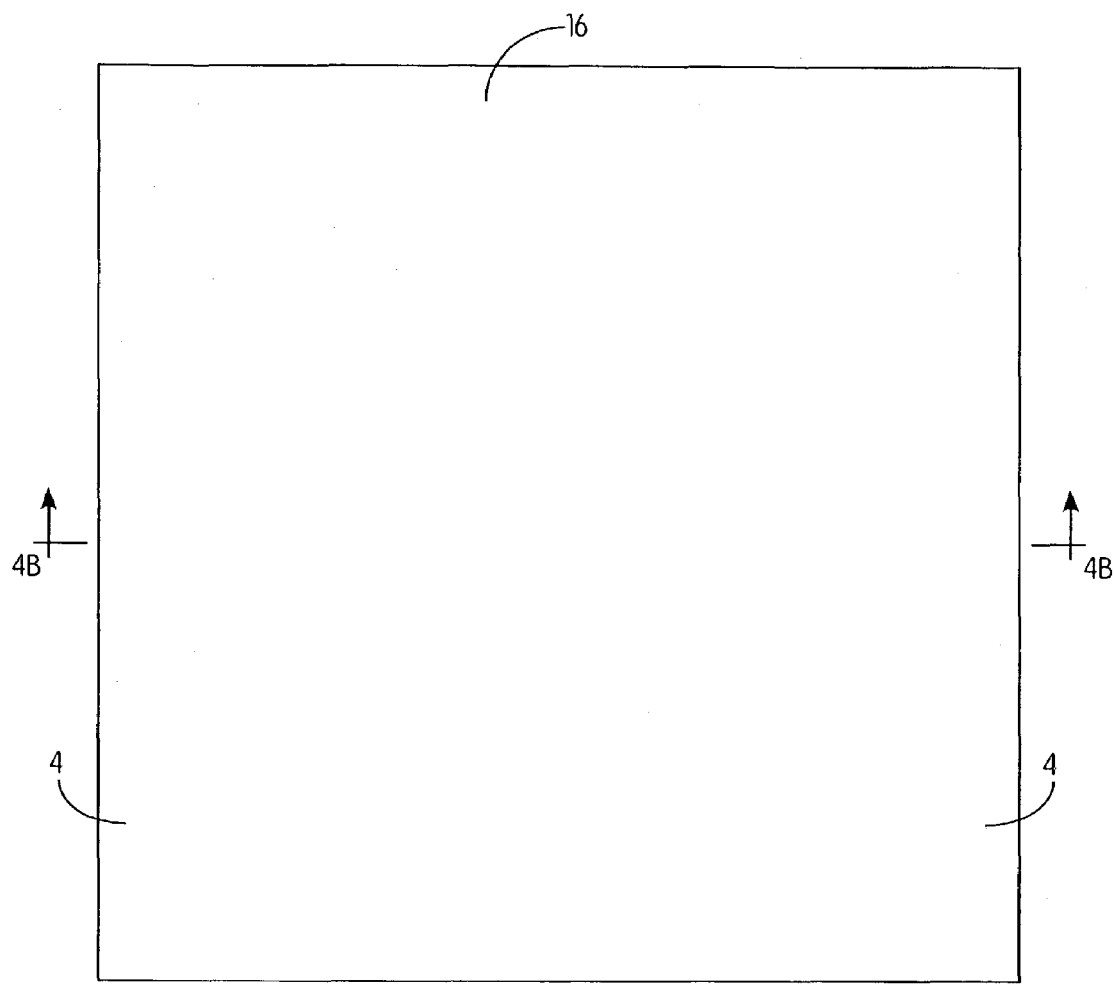
FIGS. 4A and 4B show a top view and a cross-sectional view respectively of the wafer having a second sacrificial layer deposited thereon.
Figure 4B:
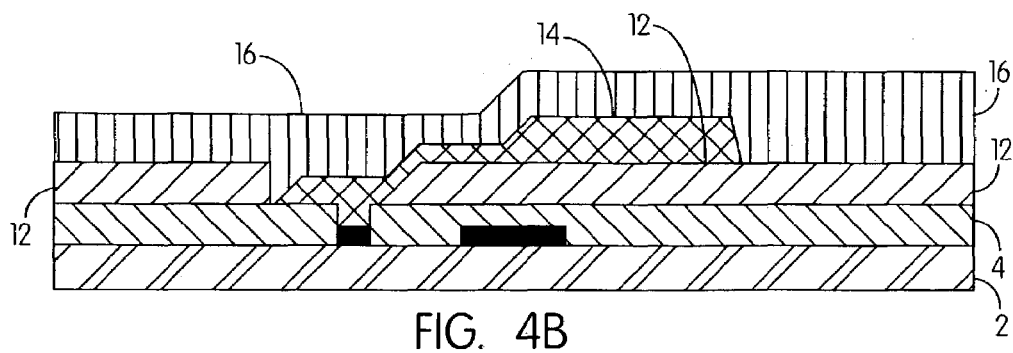

Next, as shown in FIGS. 4A and 4B, a second sacrificial layer 16 is deposited over microstructure 14. It can be seen from the top view that portions of the second sacrificial layer 16 will come into contact with portions of the bottom sacrificial layer 12, in particular, those areas near the edges of the paddle-shaped main body of the microstructure and those areas on either side of the thin connecting beam portion 15 of the microstructure.

In the preferred embodiment, and, if possible as dictated by the shape of microstructure 14, sacrificial layers 12 and 16 will be of the same material and will be in communication with each other, such that when the etchant is introduced, both layers will be etched away without the need to etch additional etchant entry holes. Alternatively, sacrificial layers 12 and 16 may be of different materials. Although not necessary in the construction of the microstructure of this example, more complex microstructures, or multiple microstructures in the same cavity may require etching away of various sacrificial layers at different times, making it necessary to use different materials for the sacrificial layers and different selective etchants.

The preferred material for sacrificial layers 12 and 16 is photoresist. Photoresist is chosen for this reason because it can be easily etched with an oxygen plasma gas, which is not destructive of aluminum microstructure 14, silicon nitride passivation layer 4 or cap layer 18.

If sacrificial layers 12 and 16 are of different materials it is possible to etch them separately by selecting an etchant that is selective to one and not the other. It is even possible that a wet etch could be used with one of the sacrificial layers. For example, sacrificial layer 16 may be phosphorous-doped glass and the etchant may be hydrofluoric acid. This may be desirable because the wet etchants are generally faster acting than the dry etchants. As long as the microstructure is held in place by one or more other sacrificial structures, the problem of breakage of delicate microstructure 14 by the forces of surface tension will be avoided. However, to avoid surface-tension induced damage, it is desirable that the last sacrificial structure binding the microstructure in place be removed using the dry etchant.

Figure 5A:
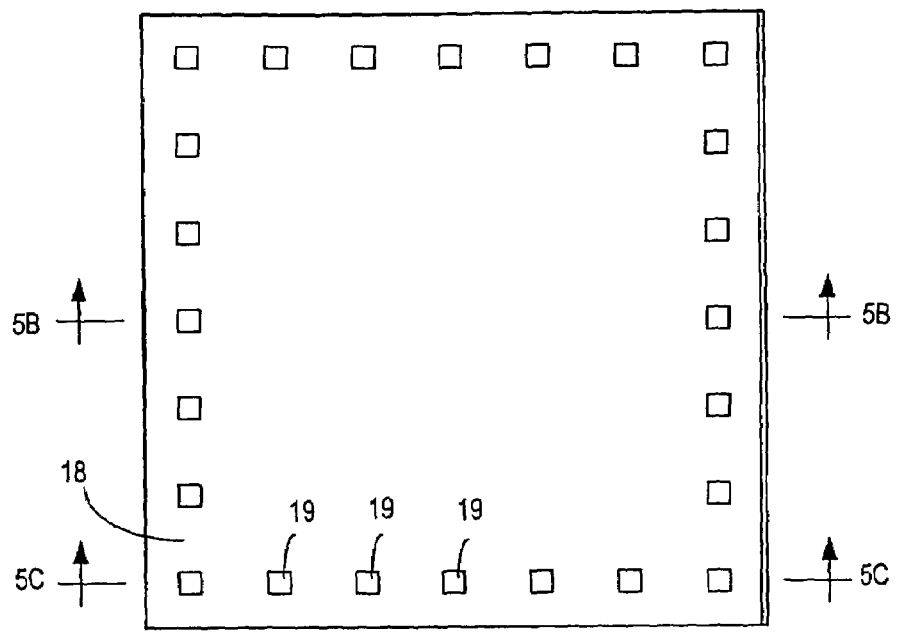
FIGS. 5A, 5B and 5C show a top view and two cross-sectional views respectively of the wafer having a mask applied thereto to etch holes for the supporting pillars of the cap layer.
Figure 5B:
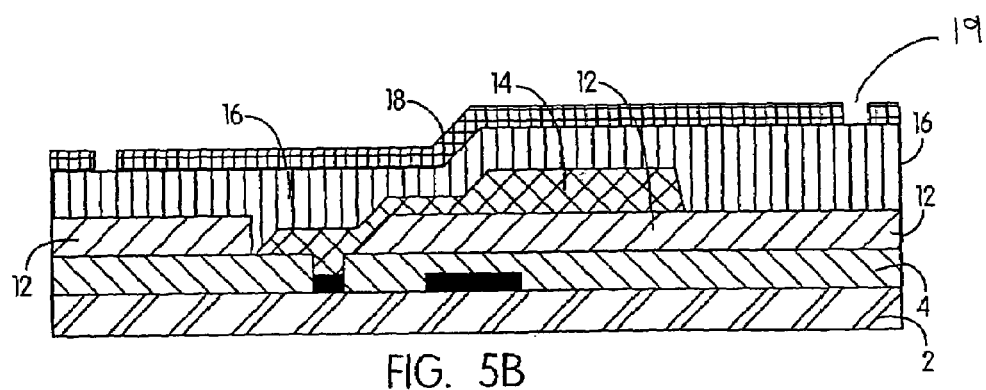
Figure 5C:
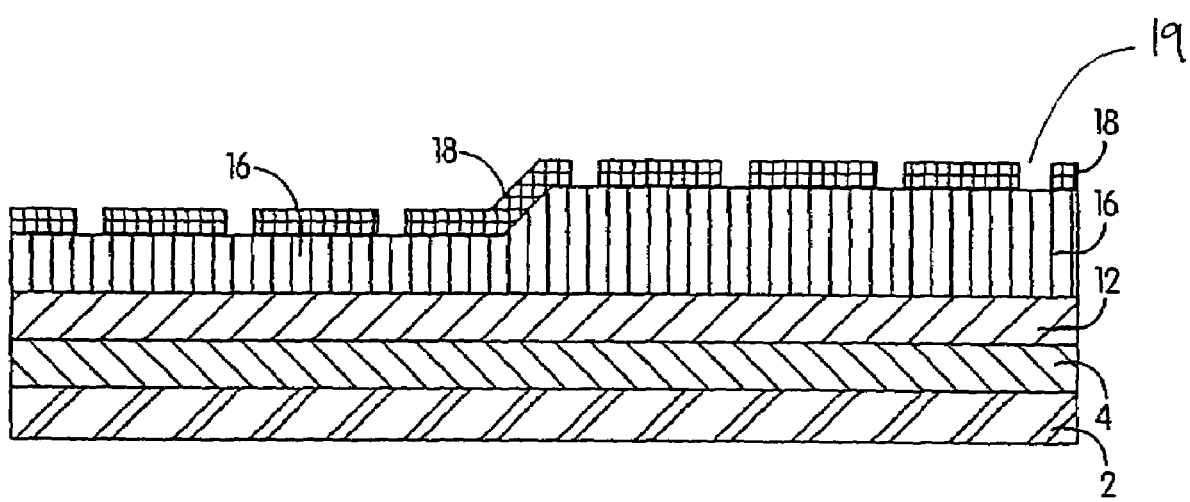

FIGS. 5A, 5B and 5C show the etching of holes 19 in the layers of sacrificial material which will be used to form the pillars which will support cap layer. If the sacrificial layers are composed of photoresist, it is possible to etch the holes using a quartz mask, which will allow unmasked photoresist to be developed away by the application of light, as is well known in the art. If the sacrificial material is another material, such as, for example tungsten, it may be necessary to etch holes through the sacrificial layers by masking the sacrificial material with photoresist and introducing an etchant, as is also well known in the art. Such a mask is shown as reference number 18 in FIG. 5B. Mask 18 is configured to allow the etching of holes 19 in the sacrificial material for the pillars that will support the cap during the release step of the fabrication process. Holes 19 are preferably etched around the periphery of the area to be covered by cap 20 to allow for the maximum area under cap 20 for the placement and design of microstructure 14.

Figure 6A:
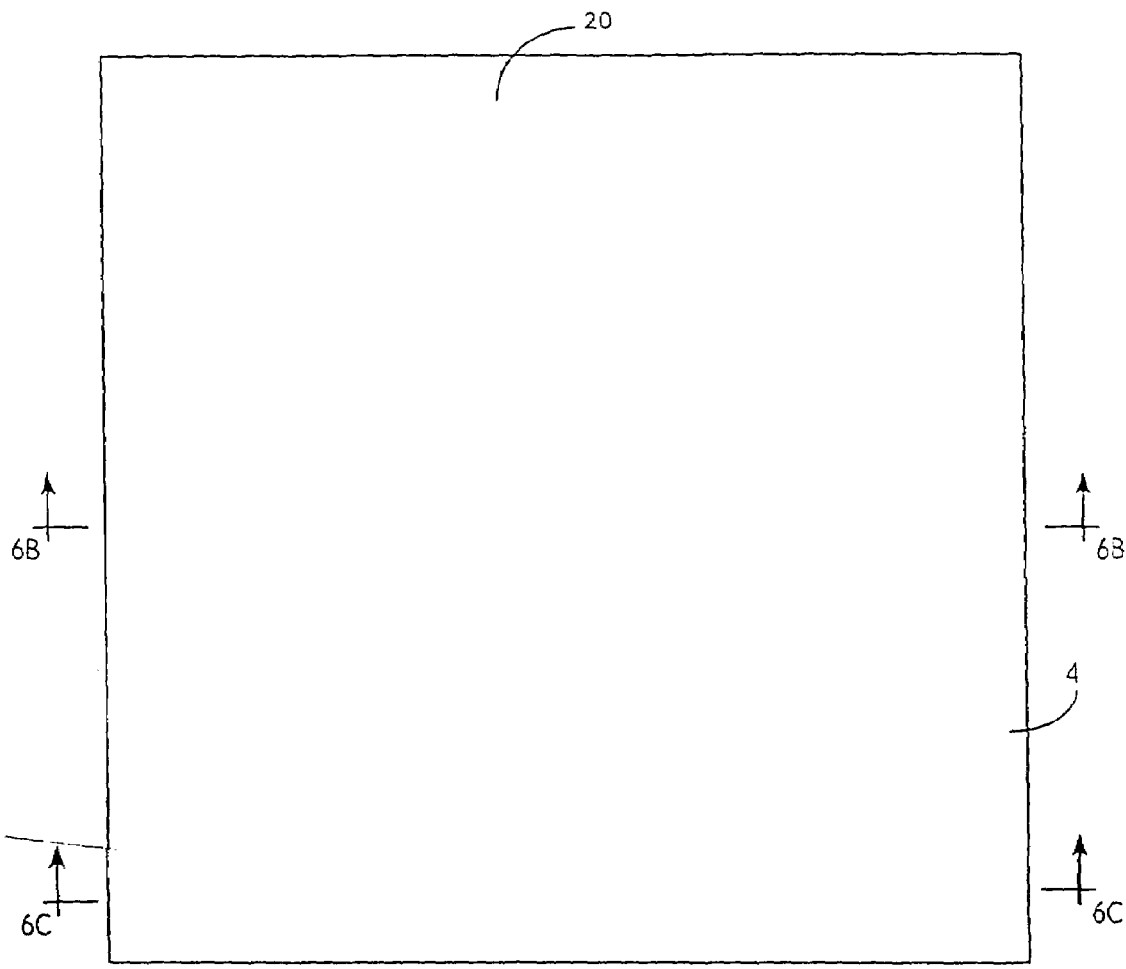
FIGS. 6A, 6B and 6C show a top view and two cross-sectional views respectively of the wafer having a cap deposited thereon, with supporting pillars.
Figure 6B:
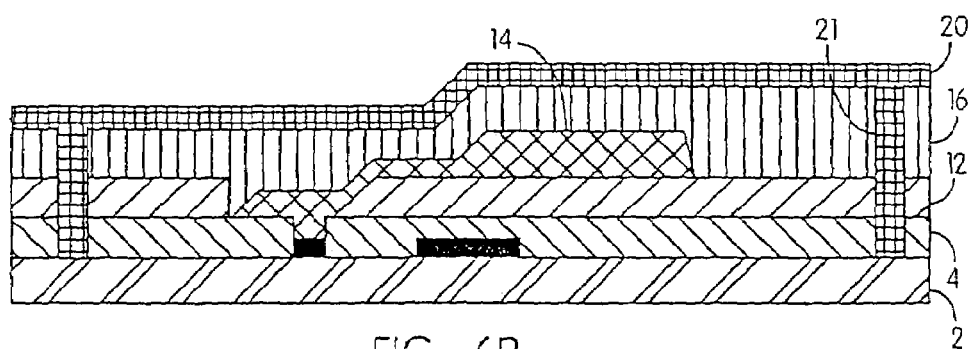
Figure 6C:
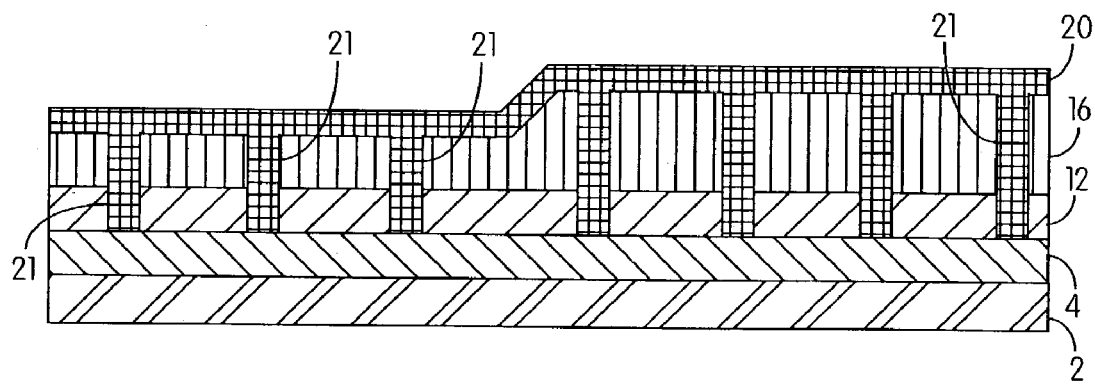

The deposition of cap 20 and pillars 21 is shown in FIGS. 6A, 6B and 6C. Cap layer 20 may be composed of an insulator or a conductor, depending on the desired electrical operation of the microstructure. Additionally, cap 20 must have a low enough residual stress and must be thick enough that the membrane created by cap 20 will not buckle after the sacrificial layers 12 and 16 have been removed. In the preferred embodiment, cap 20 is composed of the same metal as was chosen for microstructure 14, but, in alternate embodiments, may be made of any material resistant to the etchant chosen. In the event an insulating material is chosen for cap 20, it may be patterned and removed to give access to the non-MEMS parts of the integrated circuit, such as contact pads 6 and 8. If cap 20 is a conductor, it may be contacting one or both of contact pads 6 or 8.

Figure 7A:
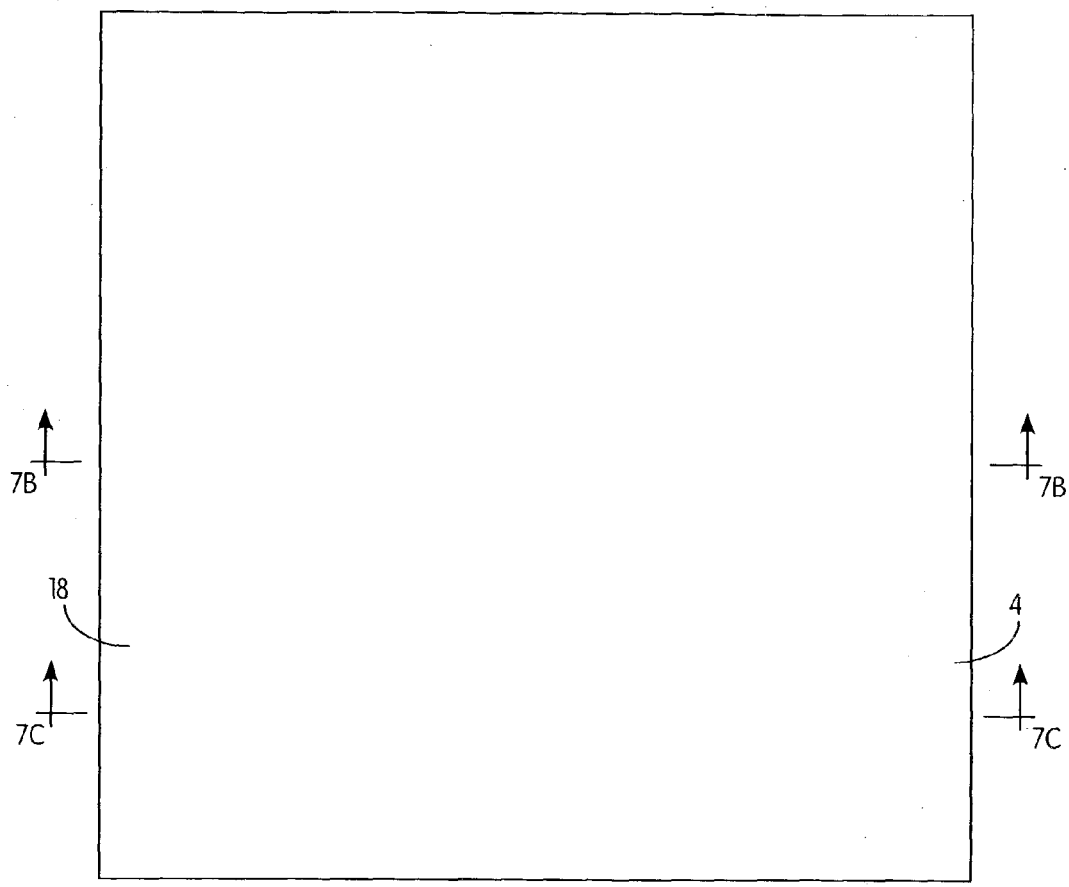
FIGS. 7A, 7B and 7C show a top view and two cross-sectional views respectively of the wafer after the sacrificial layers have been etched away.
Figure 7B:
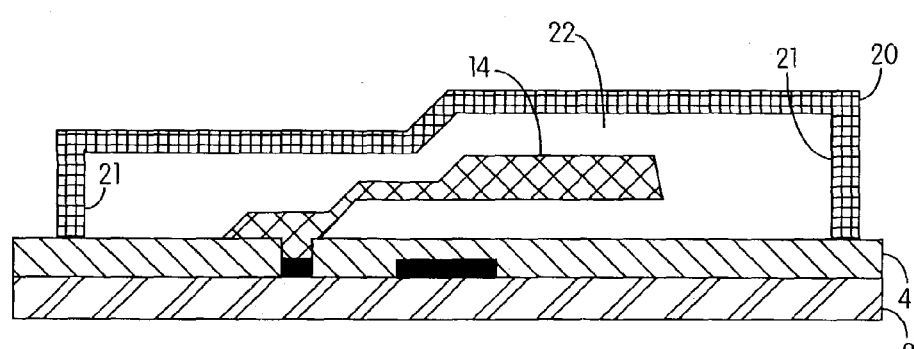
Figure 7C:
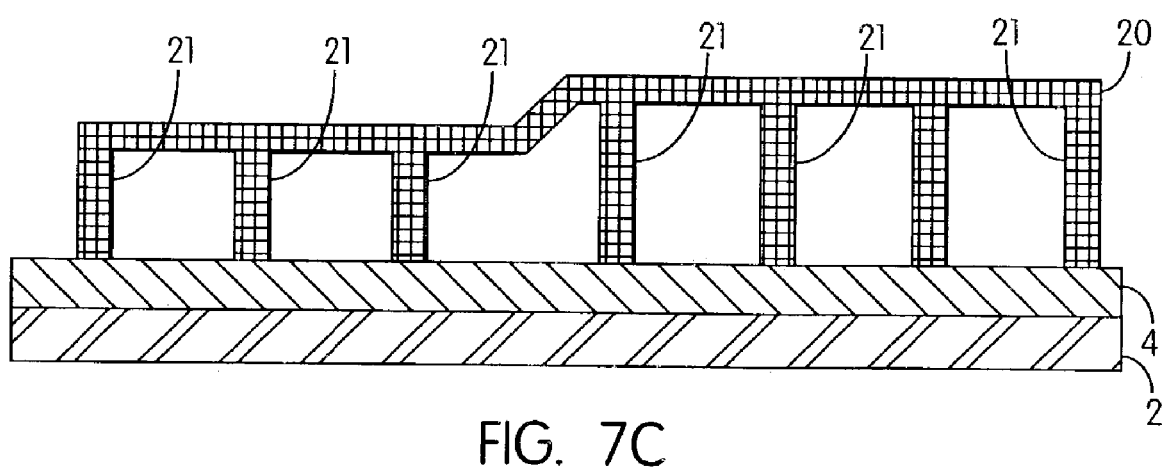

Pillars 21 are formed by the deposition of cap material into holes 19 formed in sacrificial layers 12 and 16. It is important that the deposition of cap 20 does not completely seal sacrificial layers 12 and 16. The portions of sacrificial layers 16 and 12 which extend between pillars 21 become the access vias to the interior of the encapsulation chamber when etched away, leaving voids between pillars 21. FIGS. 7A, 7B and 7C show microstructure 14 and cap 20 after the sacrificial layers 12 and 16 have been removed. Cap 20 remains supported by pillars 21. Therefore, cap 20 should not contact wafer 2 around its periphery, thereby sealing in sacrificial layer 12 and 16.

Figure 9:
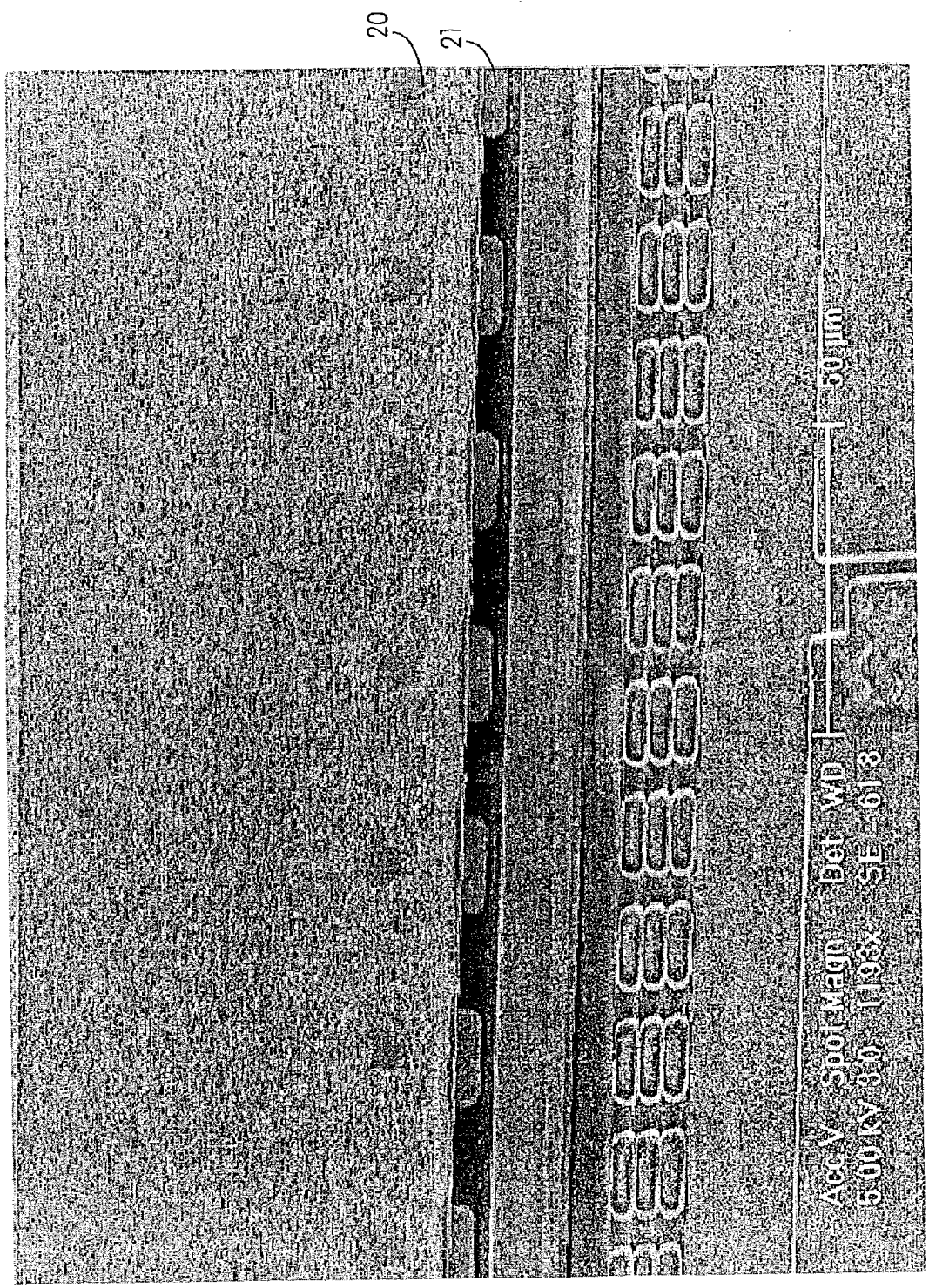
FIG. 9 is a photograph taken with an electron microscope of an actual device built according to the method of the invention, showing the pillar-supported cap prior to the seal layer being deposited.
Figure 10:
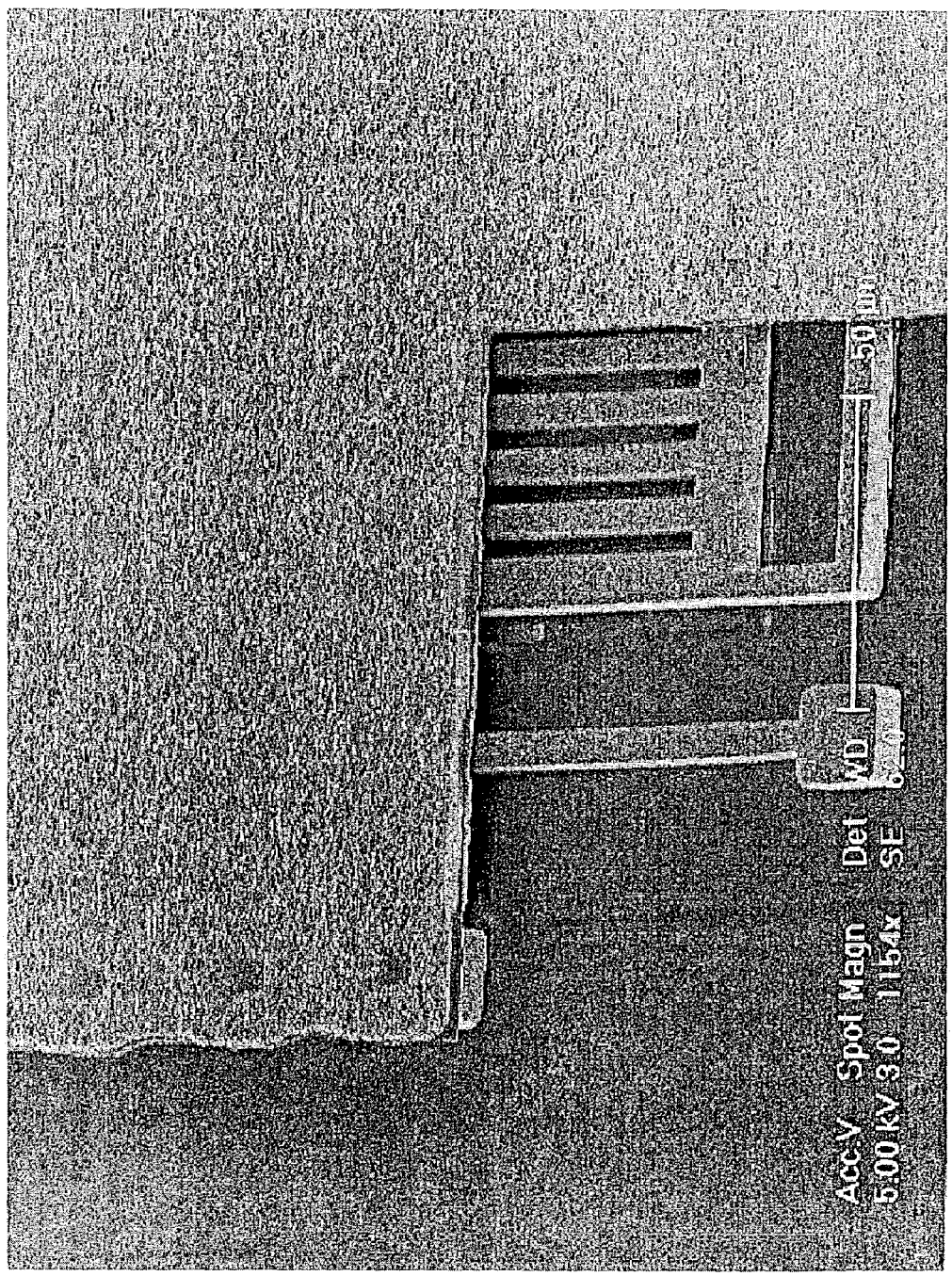
FIG. 10 is a photograph taken with an electron microscope of an actual device built according to the method of this invention, having a portion of the cap cut away to show the actual microstructure thereunder.

FIGS. 9 and 10 show photographs taken by a microscope of actual devices produced according to this invention. FIG. 10 has a portion of cap 20 cut away to reveal microstructure 14. Note that the use of pillars 21 to support cap 20 allows for extremely large and numerous entry points for the dry etchant in the spaces between pillars 21, without placing undue design constraints on the shape or size of microstructure 14.

As previously stated, it is preferable that a dry plasma etchant is used to remove the final layer of sacrificial material binding microstructure 14 to the substrate to avoid problems created by forces applied to microstructure 14 by surface tension which would result with the use of a wet etchant. In the preferred embodiment, the etchant is oxygen plasma. Oxygen plasma was chosen because it is highly selective with respect to the etching sacrificial layers 12 and 16, which may be photoresist, polyimide or other organic polymers, while having an extremely low etching rate for a wide variety of metals and insulators.

At this point, microstructure 14 is able to move within cavity 22 previously occupied by sacrificial layers 12 and 16, with beam 15 acting as a spring and contact pad 8 acting as an anchor point. The etching time using oxygen plasma is greatly speeded up over the prior art method of introducing the etchant through holes etched into cap layer 20 because the etchant access holes are now numerous and large.

Figure 8A:
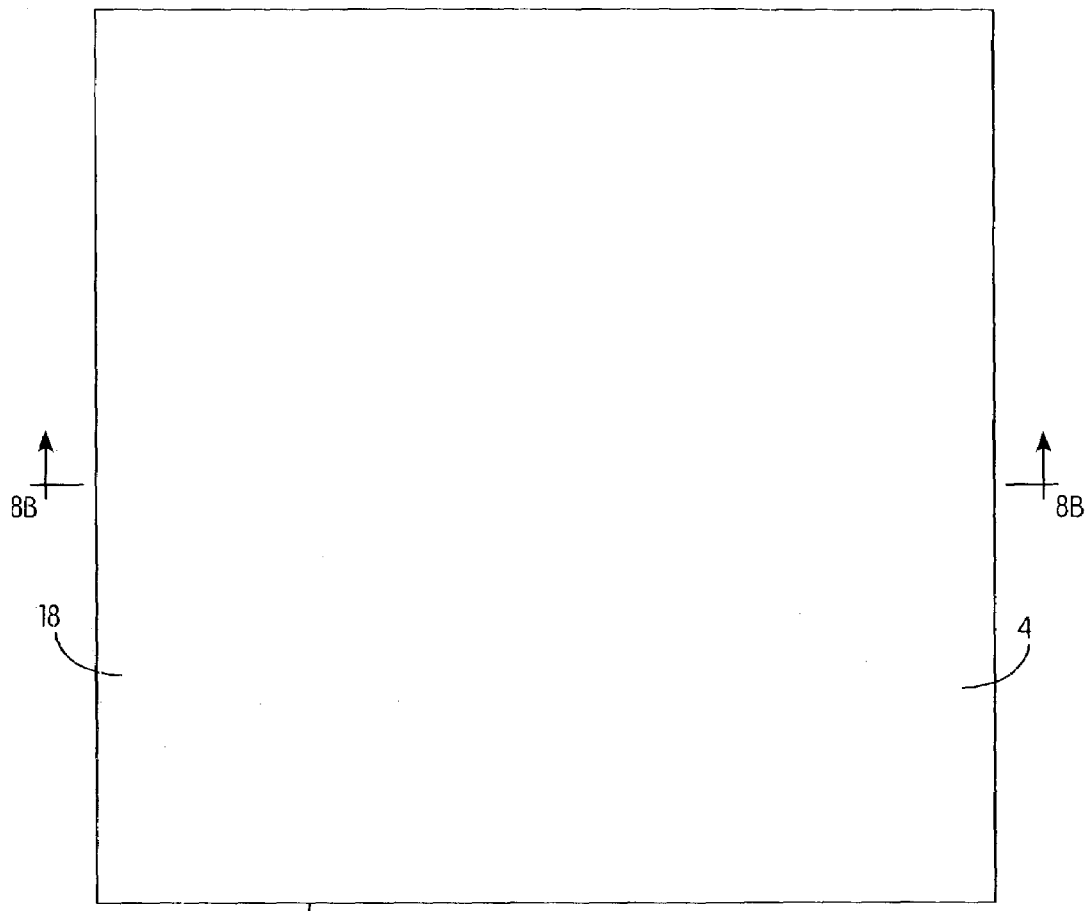
FIGS. 8A and 8B show a top view and a cross-sectional view respectively of the wafer having a seal layer applied thereon, thereby sealing the area between the pillars supporting the cap.
Figure 8B:
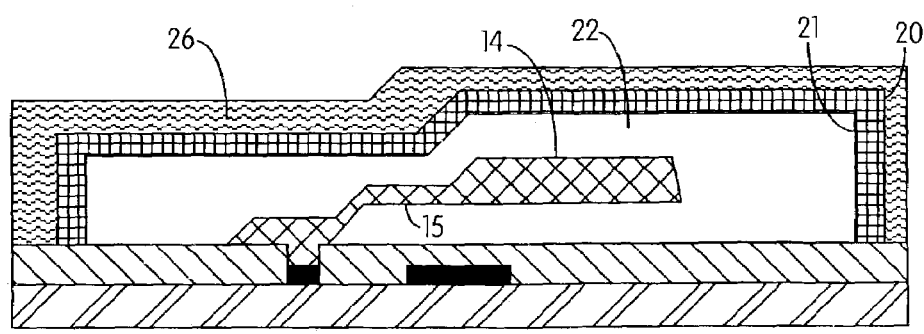

The final step, shown in FIGS. 8A and 8B, is the application of seal layer 26 to seal the etch openings naturally occurring between pillars 21. In the preferred embodiment, seal layer 26 is the same metal as cap 20 and microstructure 14.

A simple microstructure that could be utilized as a Z-axis accelerometer has been described to show the general process of creating a microstructure in a sealed cavity having a pillar-supported cap. However, as will be realized by one of ordinary skill in the art, and as contemplated by Applicant, the process may be used to build microstructures of more complexity, involving many combinations of sacrificial and structural layers. Additionally, alternative combinations of material may be utilized for the etchant/sacrificial layer combinations, as long as the etchant selected has a low etch rate with respect to the microstructure material and the material utilized for the passivation and cap and seal layers. Additionally, movable structures consisting of many layers of stacked sacrificial and structural materials are within the scope of this invention.

Lastly, the figures showing the process of forming the microstructure and etching away sacrificial material are not to scale and should not be construed as limitations on the process in this respect. As can be seen in the photographs of FIGS. 10 and 11, the scale and dimensions of an actual device are not well represented by the schematic drawings in the figures.

We claim:

1. A method of fabricating a sealed cavity for containing a microstructure comprising the steps of:
   providing a substrate;
   depositing one or more sacrificial layers on said substrate;
   etching a plurality of holes through said one or more layers of sacrificial material to said substrate;
   depositing a cap layer on top of said one or more sacrificial layers, said cap layer forming pillars supporting said cap in said plurality of etched holes; and
   introducing an etchant to said device such that said one or more sacrificial layers are etched away by said etchant and wherein said etchant enters the area under said cap layer from the sides of the cap and through holes formed when said one or more sacrificial layers is etched from between said plurality of pillars.

2. The method of claim 1 thither comprising the step of depositing a seal layer on top of said cap layer, said seal layer sealing said etched areas between said plurality of pillars.

3. The method of claim 1 wherein a portion of said sacrificial layers remains exposed when said cap layer is deposited over said one or more sacrificial layers.

4. The method of claim 1 further comprising the step of choosing said etchant to etch said sacrificial layers without substantially etching said substrate or said cap layer.

5. The method of claim 1 wherein said substrate is a wafer composed of a material selected from a group consisting of a silicon having an insulating layer deposited thereon, gallium arsenide having an insulating layer deposited thereon, alumina, "silicon on insulator" (SOT) and sapphire.

6. The method of claim 1 wherein said one or more sacrificial layers are composed of photoresist.

7. The method of claim 6 wherein said plurality of holes is formed by developing said photoresist through a mask, said mask defining where each hole of said plurality of holes is to be located.

8. The method of claim 1 wherein said plurality of holes is formed by the steps of:
   applying a mask layer over said one or more sacrificial layers, said mask layer defining the location of each of said holes;
   introducing an etchant to said device to etch said plurality of holes; and removing said mask layer.

9. The method of claim 1 further comprising the step of forming a microstructure in said cavity under said cap layer.

10. The method of claim 9 wherein said step of forming a microstructure under said cap comprises the steps of:
    depositing one or more layers of structural material between said one or more sacrificial layers; and
    shaping said structural material to the desired shape of the microstructure.

11. The method of claim 10 wherein etchant used to remove the last of said sacrificial layers binding said microstructure to said substrate is a non-liquid material.

12. The method of claim 10 wherein said step of shaping comprises the steps of:
    depositing a layer of photoresist over said layer of structural material;
    etching away at least a portion of the structural material, leaving the desired shape; and
    removing any remaining photoresist.

13. The method of claim 10 wherein said step of shaping comprises the steps of patterning a layer of photoresist; depositing said structural material; and removing said photoresist.

14. The method of claim 10 wherein said structural material is aluminum.

15. The method of claim 10 wherein said sacrificial layers are composed of an organic polymer.

16. The method of claim 15 wherein said organic polymer is photoresist or polyimide.

17. The method of claim 10 wherein said microstructure is released from said substrate when all surrounding sacrificial layers are etched away.

18. The method of claim 10 wherein said sacrificial layers are made of different materials and wherein a wet etchant may be used to remove all but the last of said sacrificial layers binding said microstructure.

19. The method of claim 10 wherein each of said sacrificial layers are composed of the same material.

20. The method of claim 19 wherein said etchant is oxygen plasma and wherein each of said one or more sacrificial layers are composed of photoresist or polyimide.

21. The method of claim 10 wherein said sacrificial layers may be composed of different materials.

22. The method of claim 21 wherein at least one of said sacrificial layers is composed of photoresist.

23. The method of claim 22 wherein said sacrificial layers composed of photoresist are removed last.

24. The method of claim 23 wherein said sacrificial layers composed of photoresist are removed using an etchant selected from a group comprising oxygen plasma and ozone.

25. A method of fabricating a sealed cavity for containing a micro structure comprising the steps of:
    providing a substrate;
    depositing a first layer of sacrificial material on said substrate;
    forming a microstructure on said first sacrificial layer of any desired shape;
    depositing a second layer of sacrificial material on said first layer of sacrificial material, covering said micro structure;
    etching a plurality of holes through said one or more layers of sacrificial material to said substrate;
    depositing a cap layer on top of said one of more sacrificial layers, said cap layer forming pillars supporting said cap in said plurality of etched holes;
    introducing an etchant to said device from the sides of the cap such that said one or more sacrificial layers are etched away by said etchant and wherein said etchant enters said sealed cavity through holes formed when said one or more sacrificial layers is etched from between said plurality of pillars; and
    depositing a seal layer on top of said cap layer, said seal layer sealing said etched areas between said plurality of pillars.

26. The method of claim 25 wherein a portion of said one or more layers of sacrificial material remains exposed when said cap layer is deposited.

* * * * *